United States Patent [19]

Konermann et al.

[11] Patent Number: 5,168,752
[45] Date of Patent: Dec. 8, 1992

[54] APPARATUS FOR TESTING THE COLOR SEPARATIONS OF A MULTICOLOR PRINT

[75] Inventors: Herbert Konermann, Lengerich; Helmut G. Sandner, Rodgau, both of Fed. Rep. of Germany

[73] Assignees: Windmoller & Holscher; Du Pont De Nemours, both of Fed. Rep. of Germany; a part interest

[21] Appl. No.: 700,699

[22] Filed: May 16, 1991

[30] Foreign Application Priority Data

Jun. 7, 1990 [DE] Fed. Rep. of Germany ....... 4018295

[51] Int. Cl.$^5$ .............................................. G03F 3/10
[52] U.S. Cl. ................................. 73/150 R; 156/272.2; 430/291
[58] Field of Search ................. 73/150 R, 150 R; 156/230, 234, 238, 272.2, 272.6, 272.8, 273.1; 430/291, 293

[56] References Cited

U.S. PATENT DOCUMENTS

| | | | |
|---|---|---|---|
| 3,450,531 | 6/1969 | Amidon et al. | 430/291 |
| 3,979,247 | 9/1976 | Berg | 156/234 X |
| 4,292,394 | 9/1981 | Chu et al. | 430/291 |
| 4,304,839 | 12/1981 | Cohen et al. | 430/253 |
| 4,356,253 | 10/1982 | Buzzell | 430/291 |
| 4,604,340 | 8/1986 | Grossa | 430/270 |
| 4,806,451 | 2/1989 | Fröhlich | 430/291 |
| 4,902,363 | 2/1990 | Delaney et al. | 430/253 X |
| 5,019,484 | 5/1991 | Shimaoka et al. | 430/293 |

FOREIGN PATENT DOCUMENTS

| | | |
|---|---|---|
| 0243933 | 11/1987 | European Pat. Off. . |
| 2623850 | 12/1976 | Fed. Rep. of Germany . |
| 0007391 | 1/1983 | Japan ................................. 156/238 |

Primary Examiner—William A. Cuchlinski, Jr.
Assistant Examiner—W. Morris Worth
Attorney, Agent, or Firm—Keck, Mahin & Cate

[57] ABSTRACT

The invention refers to an apparatus for testing the color separations of a multicolor print, comprising a pair of press rollers being mounted in a frame and constituted by rollers which can be lifted off each other, through the roller gap of which an image-bearing element consisting of a support foil with an exposed, photosensitive layer, with a color foil, consisting of a color-bearing foil with a color layer, being placed on this element, is fed such that portions of the color layer adhere to the tacky areas of the image-bearing element. For the solution of this problem to provide an apparatus of the kind by which the testing of the color separations of a multicolor print can be carried out in a simple and rapid manner, a movable frame is provided in which a plurality of pairs of roll bearings for rolls to be unwound and wound up are mounted. A roll bearing for each pair of rolls allows a roll of a color foil web to be loaded, and the color foil web can be wound up on a roll carried in the other roll bearing. The web section of the color foil web between the rolls of a pair of roll bearings runs in between the press rollers of the pair of press rollers.

10 Claims, 3 Drawing Sheets

APPARATUS FOR TESTING THE COLOR SEPARATIONS OF A MULTICOLOR PRINT

BACKGROUND OF THE INVENTION

1. Field of the Invention

This invention refers to an apparatus for testing the color separations of a multicolor print, comprising a pair of press rollers being mounted in a frame and constituted by rollers which can be lifted off each other, through the roller gap of which an image-bearing element, consisting of a support foil with an exposed, photosensitive layer, with a color foil, consisting of a color-bearing foil with a color layer, being placed on this element, is fed such that portions of the color layer adhere to the tacky areas of the image-bearing element.

2. Description of Prior Art

In multicolor printing it is advantageous to test the quality of the color separations prior to the actual printing without having to make a test printing, so that any corrections which may be necessary can be carried out and registration and positioning can be controlled. Such a testing is carried out in such a manner that corresponding halftone color separations are made from the individual originals and said color separations are copied by means of an appropriate exposure onto the photosensitive layer of an image-bearing element. In case of a preferred testing print material the photosensitive layer consists of a photopolymerizable material which is tacky at least at its surface and which is polymerized by exposure such that it loses its tackiness in the exposed areas. Then, a color-bearing foil is pressed onto the thus exposed image-bearing element such that the color layer thereof adheres to the unexposed sections due to their tackiness. Therein, the color of the color layer corresponds to the color of the color separation to be tested so that the image-bearing element carries a positive image of the color separation to be tested. On top of the image-bearing element there is then applied a second photosensitive layer as a laminate, and then the image-bearing element is exposed through a halftone color separation belonging to a second color of the original. Onto said second exposed photosensitive layer then a color-bearing foil with a second color is pressed so that to the unexposed areas again portions of the color foil adhere after the latter is peeled off, and a positive two-color image of the original is obtained. Corresponding to the colors to be used in making the print, additional photosensitive layers are applied, exposures are performed through the additional halftone color separations, the exposed layers are supplied with corresponding color applications by pressing the color layers thereonto, until a multicolor image corresponding to the original is obtained. Testing methods of said kind and photosensitive layers to be used in said testing methods are known from the German Patent Specification 26 23 850 (parallel U.S. Pat. No. 4,304,839), from the European laid-open print 243 933 and from the U.S. Pat. No. 4,356,253. Suitable color-bearing foils have been described in the German Patent Specification 36 25 014 (parallel U.S. Pat. 4,806,451) and in the German laid-open print 37 06 528 (parallel U.S. Pat. No. 4,902,363). In an analogous manner, also photosensitive layers can be used which only become tacky on exposure and which are known from the German Patent Specification 34 29 615 (parallel U.S. Pat. No. 4,604,340).

A particular problem in performing the color testing method lies in the fact to apply and press the color foil onto the corresponding exposed photosensitive layer of the image-bearing element such that after peeling off the color foil the desired image of the color separation of the original is obtained.

If by the apparatus of the kind mentioned hereinbefore for instance the color separations of a four-color print are to be tested, the image-bearing element with a separately applied and exposed photosensitive layer, together with the corresponding color foil must be transported four times through the roller gap of the pair of press rollers, which requires a certain dexterity due to the necessary manipulation and which is time-consuming.

SUMMARY OF THE INVENTION

It is an object of the present invention to provide an apparatus of the kind mentioned hereinbefore by means of which the testing of the color separations of a multicolor print can be carried out in a simple and rapid manner.

According to the invention, this problem is solved for an apparatus of the generic type such that a movable frame is provided in which a plurality of pairs of roll bearings for rolls to be unwound and wound up are mounted, that a roll bearing for each pair of rolls allows a roll of a color foil web to be loaded, and that the color foil web can be wound up on a roll carried in the other roll bearing, and that the course of the web section of the color foil web between the rolls of a pair of roll bearings runs in between the press rollers of the pair of press rollers.

With the apparatus according to the invention, the color testing can be performed in a simple, rapid and exact manner, since the color foil with the color of the corresponding color separation to be tested is held in the apparatus in form of a color web under tension so that, only when the press rollers of the pair of press rollers have been moved towards each other, it is necessary to feed the prepared image-bearing element through the roller gap.

Color testing methods with apparatus which are provided with a roll bearing for an unwinding roll and a wind-up roll of a color foil web, wherein the course of the web section of the color foil web runs in between the rolls located between the press rollers of a press roller pair, are themselves known from an obvious prior use. Since, however, each apparatus contains only one unwinding roll and one wind-up roll with a color foil web of just a single color, for each color to be tested a separate apparatus must be provided, i.e. for testing a four-color print there must be provided four apparatus. Since each of said apparatus, each of which can be used for the testing of only one color separation, must additionally comprise a pair of press rollers with press rollers movable away from each other, the mechanical expense for performing said known color testing method is very large.

In a further development of the invention it is provided that for press rollers being lifted off each other the frame is shiftable such that alternatively all web sections of the color foil webs, extending between the rolls of the pairs of roll bearings, come between the press rollers.

A particularly simple and precise handling is guaranteed when on both sides of the roller gap input tables and output tables for the image-bearing element are provided and the roller gap approximately lies in the plane of the tables. Then the image-bearing element only has to be put on the input table and to be pushed into the roller gap.

A particularly simple support of the pairs of roll bearings in the frame is obtained when said frame is designed to have the form of a drum. Then the input and output tables can be arranged approximately tangentially to said drum.

Due to the high pressures to be exerted by the press rollers, the press rollers are advantageously supported by pairs of support rollers.

In a further development of the invention it is provided that the lower press roller is fixed in position and provided with a drive. The upper press roller can be lowered by a spindle drive.

In a further development of the invention it is provided that the bearing for the upper press roller is spring-loaded, wherein the pressure force is set such that a good transfer of the color from the color foil onto the image reproducing medium is carried out.

Advantageously the roll bearing for the roll to wind up the color foil web is drivingly connected with the lower press roller by engageable tooth wheels.

According to a particularly advantageous development, the lowerable bearing for the upper press roller is provided with a peeling-off ledge for the color foil.

One embodiment of the present invention will now be described in the following with reference to the drawing.

DETAILED DESCRIPTION OF PREFERRED EMBODIMENT

Figure 1:
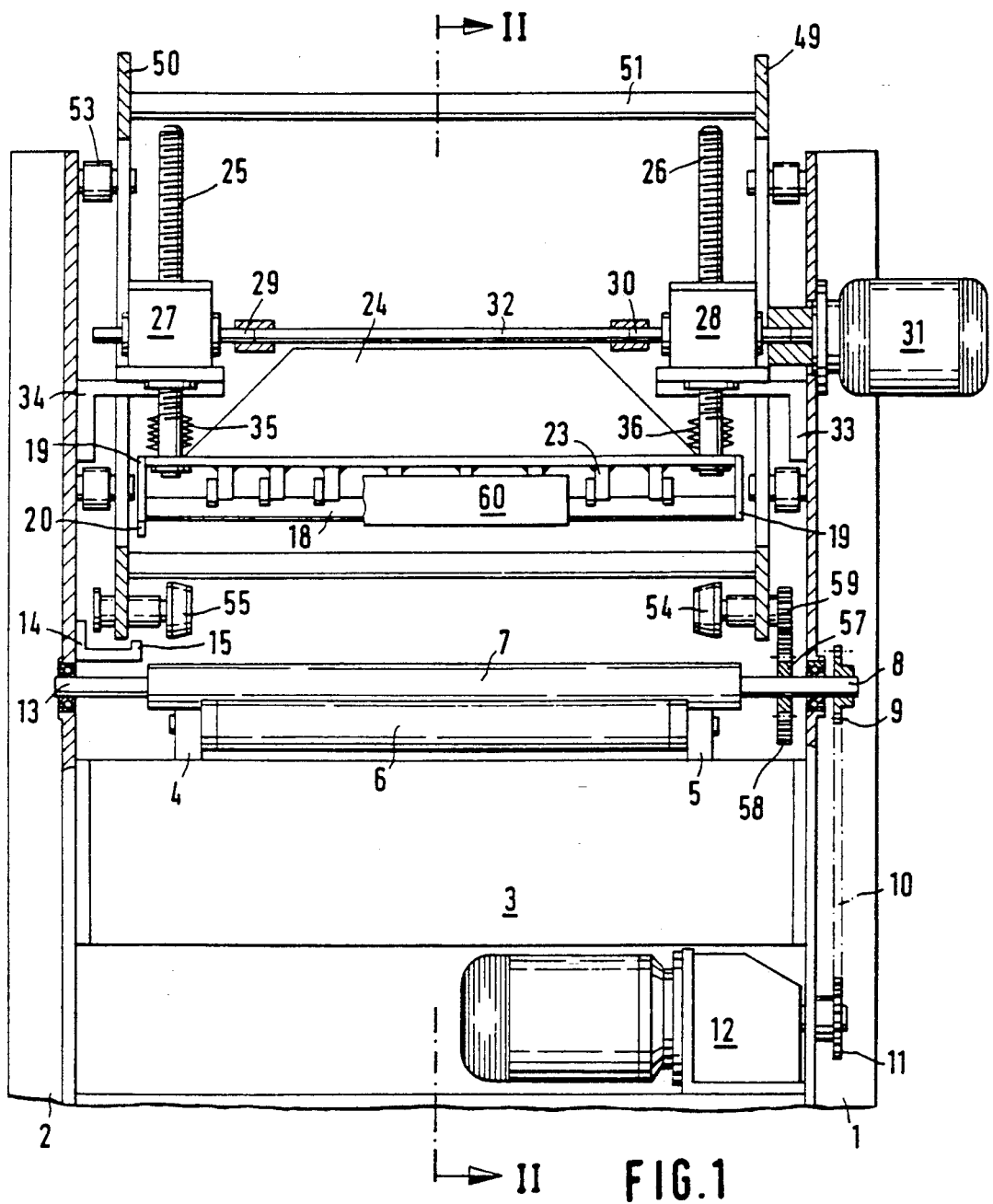
FIG. 1 shows a front view of the apparatus for testing the color separations of a multicolor print.

The machine frame consists of the two side walls 1, 2 which are fixedly interconnected by means of a strut 3. Onto the strut 3 there are welded bearing blocks 4 and 5 which receive the support rolls 6. Said two support rolls 6 support a print roller 7 which is drivingly mounted in the two side walls 1 and 2. For the purpose of driving the print roller 7, a bearing journal 8 extends sideways out of the side wall 1 and carries a chain wheel 9. Said chain wheel is connected with the chain wheel 11 of a gear motor 12 via a chain 10. Above the bearing journal 13 of the print roller 7 a receptacle 14 is connected with the side wall, which has a V-shaped cutout 15. The purpose of said receptacle 14 will be described later on.

Figure 2:
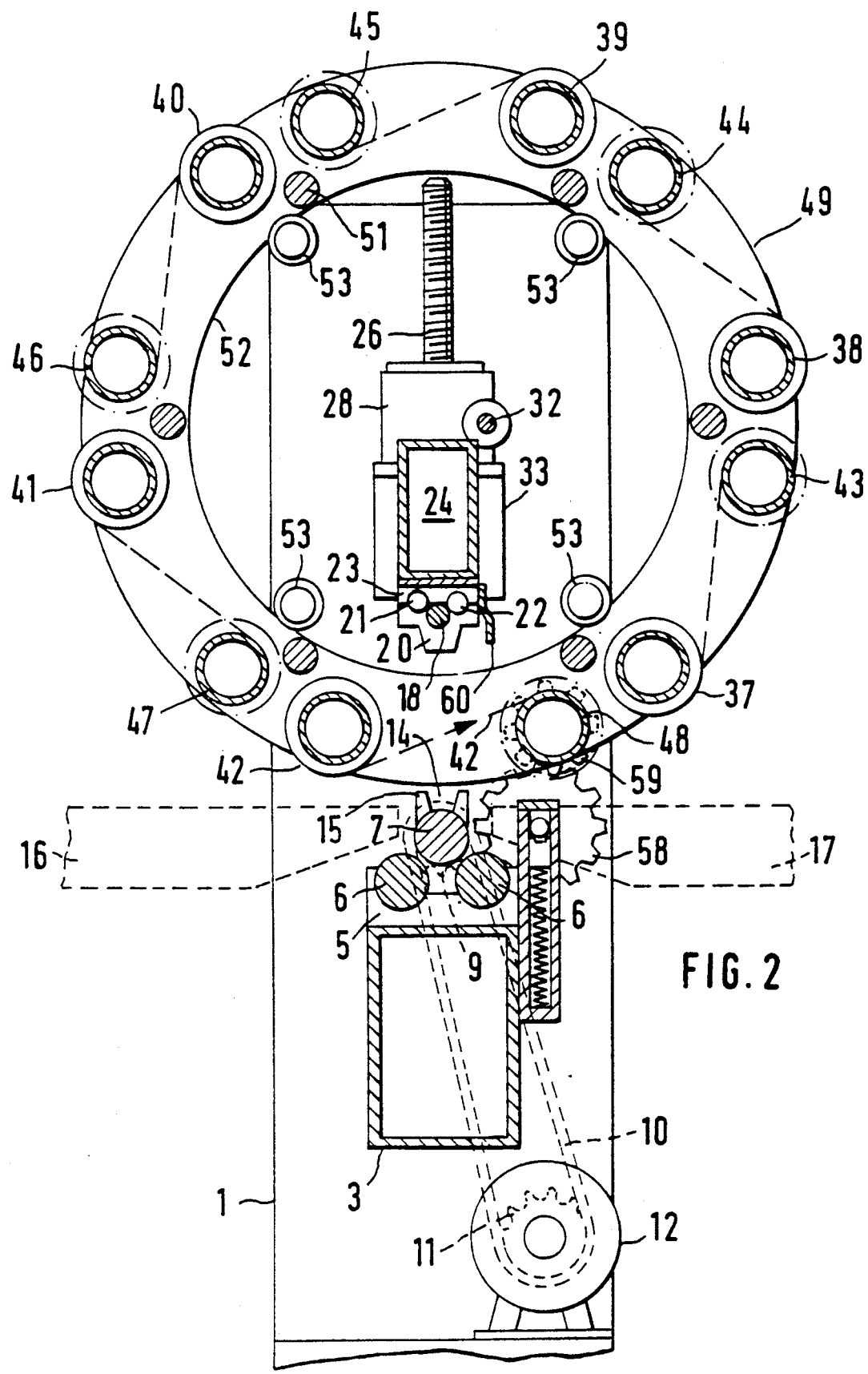
FIG. 2 is a sectional view of the apparatus along the line II—II.
Figure 3:
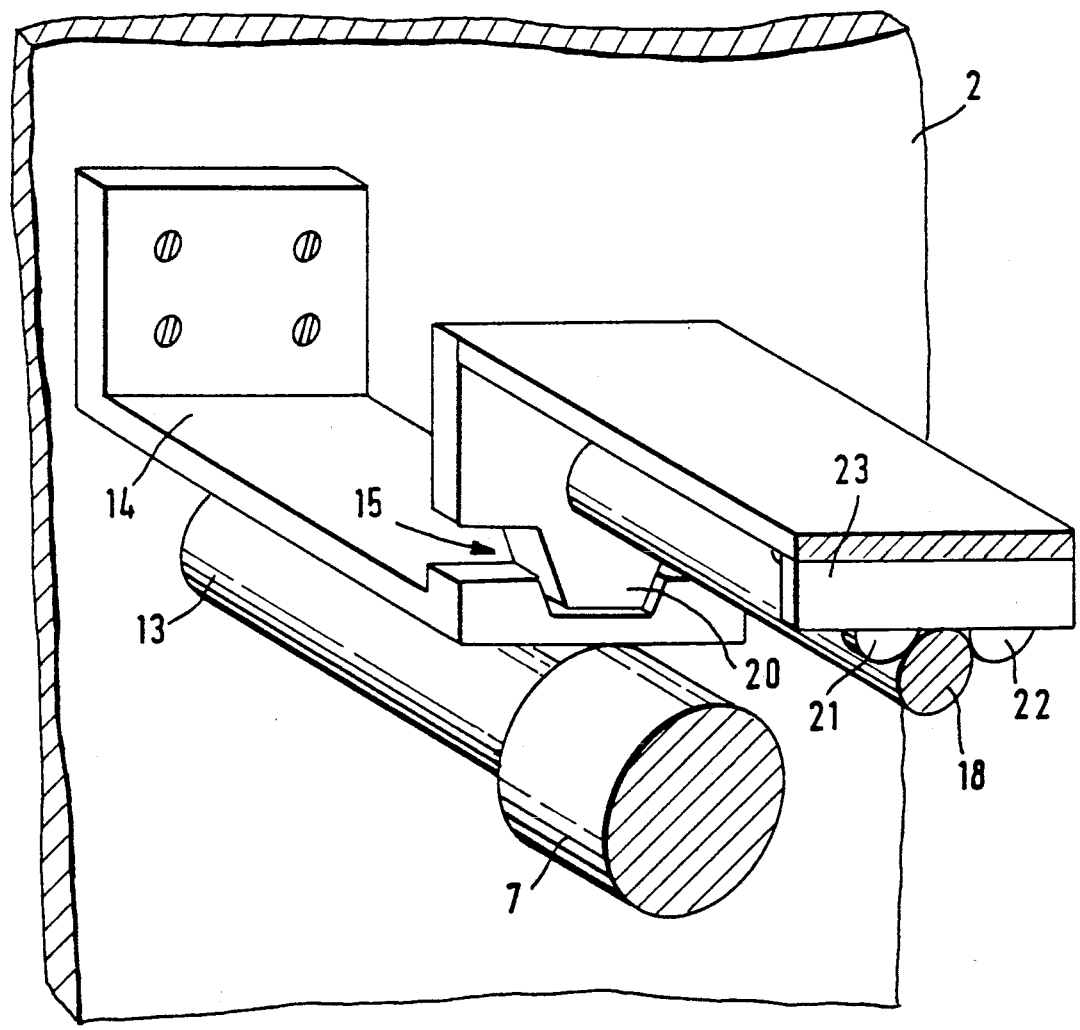
FIG. 3 is an exploded perspective view of a portion of the apparatus according to this invention, showing the relationship between projection and receiving components for the pressure process.

As can be seen from FIG. 2, to the print roller 7 there are assigned an input table 16 as well as an output table 17 which are used for the guidance of the image-bearing element. To the lower print roller 7 there is assigned an upper press roller 18 which is rotatably mounted in lateral holding means 19. Both holding means 19 are designed identically and have a projection 20 tapering downwardly. One of said two projections 20, namely the left one represented in FIG. 3, meshes with the V-shaped cutout 15 of the receptacle 14 as soon as the press roller is moved downwardly and come to lie on the print roller 7.

The purpose of the receptacle 14 and the V-shaped cutout 15 as well as the holding means 19 and the projections 20 is to secure the upper press roller 18 against lateral migration during pressure process.

Particularly from FIG. 2 there can be furthermore inferred that the press roller 18 is assigned to groups of support rolls 21 and 22 which are connected with a hollow structure 24 via bearing blocks 23. As shown in FIG. 1, the hollow structure 24 is flattened on both sides and in these two areas is connected with the spindles 25 and 26. Said spindles are mounted in the gearbox casings 27 and 28 such that no rotation thereof is permitted, wherein the input shafts 29 and 30 are respectively connected with a worm (not shown) driving corresponding worm wheels. The worm wheels have a central bore with an internal thread, which engages the external thread of the spindles 25 and 26. As soon as the motor 31 is activated, the worm wheels are rotated by the worms connected with the input shafts 29 and 30 and thereby the spindles 25 and 26, which cannot be rotated, are moved in an axial direction. The input shafts 29 and 30 are connected with each other through a shaft 32. The gearbox casings 28 and 27 themselves are put on consoles 33 and 34 which are fixedly screw-connected with the side walls 1 and 2.

In FIG. 1 it is shown that the spindles 25 and 26 are shouldered at their ends facing the hollow structure 24, wherein the shouldered portions are encompassed by pressure springs 35 and 36. Said pressure springs have the effect that when the hollow structure 24 is moved downwards, the press roller 18 softly comes to lie on the print roller 7 and can make way with respect thereto when the image-bearing element and the color carrier are passed through the roller gap.

In this case, however, the color carriers are not separate sheets, they are rather wound up to form rolls 37 to 42 which are respectively held by two receiving cones 54 and 55. To each of said wound-up color foil rolls 37 to 42 there is associated an empty core 43 to 48 onto which the individual color webs can be wound up again. The color foil rolls as well as the empty cores are held by two cones 54, 55, respectively, as already mentioned. Said cones are mounted in two wheels 49, 50 which are fixedly connected with each other through rods 51. The plates 49 and 50 are designed as ring wheels and are supported along their inner running tread 52 through guiding rolls 53 which are freely rotatably mounted in the side frames 1 and 2.

If, for instance, across the table 16 there is delivered an image-bearing element (not shown), the press roller 18 is moved downwards by means of the motor 31 and thereby presses the color foil, located between the color foil roll 42 and the empty core 48, downwardly against the print roller 7. Then the motor 12 is switched on which drives the print roller 7 via the chain 10 and the chain wheel 9, as well as the pinion gear 57 which engages a transfer wheel 58. Said transfer wheel 58 is mounted such that it can give way downward and that it meshes with a pinion gear 59 which engages the journal of the receiving cone 54 so that the cone 54 is driven when the motor 12 is switched on. Consequently, the color foil 42 rolls off during the traversing of the image-bearing element (not shown) by contacting the latter so that color is transferred to the image-bearing element. After the first passing of the image-bearing element the ring wheels 49 and 50 are rotated counterclockwise until the pinion gear of the receiving cone for the empty core 47 has engaged the transfer wheel 58. Then, after the press roller 18 has again been lowered, the image-bearing element can again be pushed through the roller gap between the press roller 18 and the print roller 7. Then, during this second passage, a second color is transferred to the image-bearing element. In the shown apparatus there is provided a total of six colors so that printing blocks for a six-color print can be tested.

For a clearly peeling of the color foil ironed on the image-bearing element during the latter's passage through the roller gap off the image-bearing element, in the section of the roll group 22 a peeling-off ledge 60 is firmly connected with the bearing blocks 23, by which the effect is obtained that the color web ironed on an image-bearing element is for instance pulled off the empty core 48 vertically upwardly. This kind of peeling an ironed-on color web off an image-bearing element is particularly favourable.

We claim:

1. Apparatus for testing the color separations of a multicolor print, comprising:
    a stationary frame;
    an upper press roller and a lower press roller, at least one press roller being driven and one being movable by a spindle drive means mounted in said stationary frame, wherein said press rollers are adapted for positioning in a first position spaced away from each other and in a second position adjacent each other, means for driving said at least one press roller,
    a roller gap between said press rollers in said second position through which an image-bearing element, comprising a support foil having an exposed, photosensitive layer with tacky and nontack areas according to the image, and a color foil web comprising a color-bearing foil with a color layer for placing on said image-bearing element, is fed while said at least one press roller is driven such that portions of the color layer adhere to the tacky areas of the support foil of the image-bearing element,
    a movable frame mounted on said stationary frame; and
    a plurality of pairs of roll bearing and means for driving at least one bearing of selected pairs of roll bearings for winding and unwinding a plurality of pairs of rolls mounted on said movable frame, wherein a first pair of said roll bearings for each pair of rolls allows a roll of color foil web to be loaded thereon for winding onto a roll carried in a selected pair of said roll bearings, and wherein during winding the course of the color foil web between the rolls on the first pair and the selected pair of roll bearings runs in said roller gap between the press rollers.

2. Apparatus according to claim 1, wherein with said press rollers in said first position, the movable frame is movable such that each of the color foil webs extending between the rolls on the pairs of roll bearings can sequentially be brought between the press rollers.

3. Apparatus according to claim 1, wherein on both sides of the roller gap input tables and output tables are arranged and the roller gap lies approximately in the plane of the tables.

4. Apparatus according to claims 1, wherein the movable frame has have the form of a drum.

5. Apparatus according to claim 1, wherein the press rollers are supported by support rollers.

6. Apparatus according to claim 1, wherein the lower press roller is fixed in position and is driven by said means for driving said at least one press roller.

7. Apparatus according to claim 1, wherein the upper press roller (18) can be lowered by said spindle drive means.

8. Apparatus according to claim 1, wherein the upper press roller is coupled to said spindle drive means by pressure springs.

9. Apparatus according to claim 1, wherein at least one bearing of the selected pair of roll bearings for the roll for winding up the color foil web is drivingly connected with the lower press roller by engageable tooth wheels for avoiding formation of folds.

10. Apparatus according to claim 1, wherein the upper press roller comprises means for supporting a peeling-off ledge for the color foil, whereby the color foil is pulled off the image-bearing element substantially vertically upwards around said ledge when the upper press roller is in a lowered position.

* * * * *